United States Patent
Dietz et al.

(10) Patent No.: US 9,229,078 B2
(45) Date of Patent: Jan. 5, 2016

(54) METHOD FOR REDUCING MECHANICAL VIBRATIONS IN A MAGNETIC RESONANCE IMAGING SYSTEM

(71) Applicants: Peter Dietz, Fuerth (DE); Andreas Krug, Fuerth (DE)

(72) Inventors: Peter Dietz, Fuerth (DE); Andreas Krug, Fuerth (DE)

(73) Assignee: Siemens Aktiengesellschaft, München (DE)

( * ) Notice: Subject to any disclaimer, the term of this patent is extended or adjusted under 35 U.S.C. 154(b) by 574 days.

(21) Appl. No.: 13/723,423

(22) Filed: Dec. 21, 2012

(65) Prior Publication Data

US 2013/0162249 A1 Jun. 27, 2013

(30) Foreign Application Priority Data

Dec. 21, 2011 (DE) .......................... 10 2011 089 445

(51) Int. Cl.
*G01R 33/44* (2006.01)
*G01R 33/28* (2006.01)
*G01R 33/385* (2006.01)
*G01R 33/421* (2006.01)

(52) U.S. Cl.
CPC .............. *G01R 33/44* (2013.01); *G01R 33/28* (2013.01); *G01R 33/3854* (2013.01); *G01R 33/4215* (2013.01)

(58) Field of Classification Search
CPC .... G01R 33/28; G01R 33/44; G01R 33/3854; G01R 33/4215
See application file for complete search history.

(56) References Cited

U.S. PATENT DOCUMENTS

| | | | |
|---|---|---|---|
| 6,462,547 B1 | 10/2002 | Heid et al. | |
| 6,498,488 B2 * | 12/2002 | Takeshima | G01R 33/383 324/309 |
| 6,501,275 B1 | 12/2002 | Westphal | |
| 6,853,282 B2 * | 2/2005 | Kuth | G01R 33/3854 335/216 |
| 7,375,518 B2 * | 5/2008 | Kurome | G01R 33/3806 324/307 |
| 7,635,981 B2 * | 12/2009 | Kurome | G01R 33/3806 324/307 |

(Continued)

FOREIGN PATENT DOCUMENTS

| | | |
|---|---|---|
| DE | 19927494 A1 | 10/2000 |
| DE | 19947539 A1 | 4/2001 |
| DE | 10011034 A1 | 9/2001 |
| WO | WO 2005/052624 A1 | 6/2005 |

OTHER PUBLICATIONS

German Office Action dated Sep. 18, 2012 for corresponding German Patent Application No. DE 10 2011 089 445.4 with English translation.

*Primary Examiner* — Dixomara Vargas
(74) *Attorney, Agent, or Firm* — Lempia Summerfield Katz LLC

(57) ABSTRACT

The present embodiments relate to a method for reducing mechanical vibrations in a magnetic resonance imaging system that includes a gradient system having a gradient coil body and an electrically conductive shroud that at least partly encloses the gradient coil body. The method includes determining a mechanical natural vibration mode of the gradient coil body in the magnetic resonance imaging system, and determining excitation force components for the natural vibration mode. The method also includes determining electrically conductive areas of the gradient system, which during operation of the magnetic resonance imaging system, generate a Lorentz force component that contributes to the excitation force components. The method further includes modifying the determined electrically conductive areas such that a minimal number of the Lorentz force components coincide with the excitation force components.

22 Claims, 3 Drawing Sheets

(56) References Cited

U.S. PATENT DOCUMENTS

| | | | | |
|---|---|---|---|---|
| 7,755,359 B2 * | 7/2010 | Yamamizu | ............ | A61B 5/055 324/320 |
| 8,022,706 B2 * | 9/2011 | Ham | ................ | G01R 33/34076 324/318 |
| 8,148,987 B2 * | 4/2012 | Kruip | ................ | G01R 33/3854 324/318 |
| 8,212,564 B2 * | 7/2012 | Tsuda | ................ | G01R 33/3806 324/318 |
| 8,466,681 B2 * | 6/2013 | Tsuda | ................ | G01R 33/3806 324/319 |
| 2001/0027264 A1 | 10/2001 | Gebhardt | | |

\* cited by examiner

METHOD FOR REDUCING MECHANICAL VIBRATIONS IN A MAGNETIC RESONANCE IMAGING SYSTEM

This application claims the priority benefit of German Patent Application No. DE 10 2011 089 445.4, filed Dec. 21, 2011, which is hereby incorporated by reference.

BACKGROUND

The present embodiments relate to a method for reducing mechanical vibrations in a magnetic resonance imaging system, a gradient system for reducing mechanical vibrations, and a magnetic resonance imaging system with a gradient system for reducing mechanical vibrations.

Imaging systems that utilize magnetic resonance measurement (e.g., nuclear resonance or magnetic resonance tomographs) have been established and proven through numerous applications. In these systems, a static basic magnetic field may be used for data acquisition. The static basic magnetic field, which is used for initial alignment and homogenization of magnetic dipoles to be examined, is overlaid for local resolution of the imaging signal with a rapidly switched magnetic field (e.g., the gradient field). Depending on the mode of operation of the imaging system, different switching sequences and magnetic field strengths are applied. The gradient coil system or gradient system for generating the gradient field may be a rapidly switched electrically-operated magnet system with one or more gradient coils, which may generate magnetic fields in spatial directions x, y and z orthogonal to one another. The gradient coils are molded into a gradient body.

Because of the interaction of the gradient system with the basic magnetic field, which may have high magnetic field strengths of a few Tesla, the gradient system is subjected to immense stress forces. In such cases, the gradient system, depending on the operating state of the imaging system, may be excited into strong mechanical vibrations. The mechanical vibrations depend on, inter alia, factors such as the frequency of the switchover of the gradient field from the damping by the support of the gradient field. The general system conditions of support and damping as well as the mechanical properties of the gradient system result in the formation of natural vibrations of the gradient system in the magnetic resonance imaging system.

To improve the image quality (e.g., improve the signal-to-noise ratio), the basic magnetic fields mostly generated with the aid of superconducting magnetic coils reach strengths of 3 Tesla and more. In operation, however, as the operating current of the superconducting coils is increased, the danger that the superconductivity of the superconducting magnetic coils will be lost or decrease increases.

Stray fields of the gradient system lead to high loads on the basic magnet system and, for example, induce eddy currents in a cold shield of the superconducting basic magnetic system, which may include conductive materials. The induction of eddy currents may lead to an increased heat input into the cooling system of basic magnets and may, in some cases, even lead to the collapse of the superconductivity during the normal operation of the magnetic resonance imaging system. The magnetic resonance imaging system may be permanently destroyed by this.

In addition, the Lorentz forces acting on the gradient system strengthen as the strength of the basic magnetic field increases, so that the vibration excitation of a gradient system in a basic magnetic field of the described strength leads to greater noise loading and may also adversely affect the image capture.

Thus, the interaction of stray fields of the gradient system is suppressed (e.g., in relation to the basic magnet that generates the basic magnetic field of 3 or more T. In addition, mechanical vibrations may be reduced, or the excitation of the mechanical vibrations may be weakened.

SUMMARY AND DESCRIPTION

The present embodiments may obviate one or more of the drawbacks or limitations in the related art. For example, stray fields of a gradient system may be screened while simultaneously optimizing and reducing mechanical vibrations in a magnetic resonance imaging system.

In one embodiment, a method for reducing mechanical vibrations in a magnetic resonance imaging system is provided. The magnetic resonance imaging system includes a gradient system that has a gradient coil body with a number of gradient coils and an electrically-conductive shroud or screen that partially or completely encloses the gradient coil body. The screen is provided to screen out stray fields of the gradient system. The method includes determining mechanical natural vibration modes in the magnetic resonance imaging system and excitation force components for the natural vibration mode. The method also includes determining electrically conductive areas of the gradient system. During operation of the magnetic imaging system, the electrically conductive areas create a Lorentz force component that contributes to the excitation force components. The electrically conductive areas include both the gradient coils of the gradient system and the electrically conductive shroud.

The method further includes modifying the specific electrically conductive areas so that the fewest possible number of the Lorentz force components coincide with the excitation force components or so that the excitation force of the natural vibration is minimized.

In another embodiment, a gradient system that includes a gradient coil body with a number of gradient coils and an electrically-conductive shroud that partially or completely encloses the gradient coil body is provided. The gradient system may be constructed or manufactured using one of the methods described herein.

In yet another embodiment, a magnetic resonance imaging system that includes such a gradient system is provided. The magnetic resonance imaging system includes a plurality of further components such as, for example, basic magnets (e.g., the basic magnets mentioned above), a high-frequency transmission system, a high-frequency receiving system, a controllable patient couch, and a control device (e.g., a controller). Other components may be provided as well.

The present embodiments, by including a conductive shroud, may effectively at least partially screen-out stray fields of the gradient system. Paths of the eddy currents that are induced by the magnet system in the conductive shroud are selected so that the resulting Lorentz forces do not contribute to an excitation of natural vibrations of the magnet system. Mechanical natural vibrations of the magnetic resonance imaging system are thus reduced, and the excitation force of the natural vibration becomes minimal.

The necessary screening effect only slightly changes relative to the stray fields through the conductive shroud or relative to screening with modified eddy current paths in or on the shroud, and an insignificant change in the stability or weight distribution of the gradient coil body may be achieved.

The description of one category may also be developed in accordance with another category.

In some embodiments, the gradient coil body includes a longitudinal tubular gradient coil body having a longitudinal axis or longitudinal extent oriented in the direction of the basic magnetic field, as described above. The direction of the longitudinal extent is thus referred to below as synonymous with the orientation direction of the basic magnetic field.

In other embodiments, the gradient coil body may not have a tubular gradient coil body. Instead, the gradient coil body may, for example, have an essentially "C"-shaped or "U"-shaped cross-section orthogonal to the longitudinal extent (e.g., for "open" magnetic resonance tomographs).

As noted above, the screening effect may be determined by the conductive shroud. Accordingly, the shroud may be positioned to conduct the eddy current with minimal thermal losses. Advantageously, the skin effect that determines the penetration depth of eddy currents into the shroud may be taken into account.

This may, for example, be done when adapting the thickness of the shroud in order to keep the heat developed by the eddy currents within allowable limits and to optimize the thickness with respect to the stray fields to be screened out. In such cases, the electrically conductive shroud may have a thickness transverse to the longitudinal extent of the gradient coil body. The thickness at least corresponds to the skin penetration depth, the penetration depth into the shroud by induced eddy currents being defined based on the skin effect.

In some embodiments, the conductive shroud has a thickness that depends on a largely (e.g., substantially) complete screening of at least the portion of the magnetic field of the gradient coil system that is transverse to the longitudinal extent of the gradient coil body. In these embodiments, the thickness of the shroud is at least 0.5 mm and, at most, 5 mm.

In addition, the shroud, at least for these layer thicknesses, has a specific conductivity of at least $1.6 \cdot 10^7$ S/m.

In some embodiments, the electrically conductive shroud completely surrounds the gradient coil body in the circumferential direction in order to, for example, completely screen out radial stray fields as much as possible.

The electrically conductive shroud or screen has a number of areas that at least partially enclose the gradient coil body in the circumferential direction. In some embodiments, the areas of the shroud in the circumferential direction enclose. A complete shroud in the circumferential direction is expressed as the shroud or screen having a number of areas that in the circumferential direction completely enclose the gradient coil body. In one embodiment, at least 70% of the circumferential surface of the gradient coil body is enclosed. In one embodiment, the areas of the shroud in the circumferential direction enclose 100% of the circumferential surface of the gradient coil body. The at least partial enclosure of the gradient coil body by the shroud produces an optimum screening effect. Missing surfaces (e.g., those surfaces that are not enclosed) may not interrupt the basic tracks of the eddy currents. In other words, continuous slots that divide the conductive surface into part surfaces may not be involved. This provides that there is little adverse effect on the screening effect.

The conductive shroud may have one or more modification elements (e.g., in proportion to the longitudinal extent of the gradient coil body) short slots or other elements embodied for spatial current limiting or current guidance, for modification of Lorentz forces of induced currents or for modification of the current path of induced currents.

For example, with the aid of the modification elements, the inclusion or the exclusion of specific areas of the conductive shroud in the current path of induced eddy currents and thus a change in the induced eddy current distribution may be achieved. By displacing the current path or modifying the eddy current distribution, a displacement of Lorentz force components may be achieved.

In some embodiments, the modification elements include one or more cutouts in the conductive shroud, which may, for example, include the slots. In addition, the cutouts may, for example, be selected so that the thickness of the shroud is reduced at the location of the cutouts. The screening effect of the conductive shroud is not changed or is minimally changed by this, while at the same time the eddy current path may be displaced.

In addition, the conductive shroud may include or be formed of a number of layers connected to each other conductively or by insulators. A modification element may be formed by the combination of a number of the shroud layers. The conductive layers may, for example, differ in surface form.

By modifying eddy current paths in the conductive shroud, one or more of the specific Lorentz force components that act on the conductive shroud are displaced into a nodal plane of the natural vibration mode.

As used herein, a nodal plane of a natural vibration mode refers to a plane having one or more points in or on the gradient coil body (e.g., points of a volume enclosed by the gradient coil body) that remain at rest during excitation of the natural vibration mode (e.g., the one or more points are disposed at a fixed location during operation of the magnetic resonance imaging system). The observation points of the enclosed volume may, for example, be deemed to be connected to the gradient coil body. In such an example, a normal vector of the nodal plane is oriented parallel to the longitudinal extent of the gradient coil body.

Displacement into a nodal plane enables the number or the vector sum of the Lorentz force components that contribute to an excitation of the natural vibration mode of the magnetic system to be reduced, which, results in a reduced excitation of natural vibration modes.

The methods described herein may be applied to a number of different natural vibration modes differing from one another. In one embodiment, the methods described herein may be simultaneously applied to a number of different natural vibration modes simultaneously.

In some embodiments, determining one mechanical natural vibration mode of the gradient coil body in the magnetic resonance imaging system may include determining a number of mechanical natural vibration modes of the gradient coil body. In these embodiments, excitation force components for these natural vibration modes may be determined. Moreover, electrically conductive areas of the magnet system, which contribute to the excitation force and include both the gradient coils and the electrically conductive shroud, may be determined. The specific electrically conductive areas may be modified so that the fewest possible of the Lorentz force components coincide with the excitation force components determined, or the excitation force of the natural vibration is minimal.

In some embodiments, common nodal planes of these natural vibrations may be determined, so that the current paths or portions of the current paths of induced eddy currents may be displaced into these common nodal planes and, thus, a simultaneous reduction of the excitation of a number of different natural vibration modes may be achieved.

As noted above, one of the present embodiments includes a magnetic resonance imaging system with a gradient system having a gradient coil body with a number of gradient coils and an electrically conductive shroud that partially or completely surrounds the gradient coil body. The electrically conductive shroud may have an area disposed in a nodal plane of a natural vibration mode. During operation of the magnetic resonance system, the area conducts the highest current density of eddy currents induced in or on the conductive shroud.

DETAILED DESCRIPTION OF THE DRAWINGS

During operation of a magnetic resonance imaging system 10, superconducting gradient coils are used to create a static, homogeneous basic magnetic field B0 and to undertake a basic alignment of magnetic moments in parallel to the basic magnetic field B0, so that a defined magnetization of an object to be imaged is present. This defined magnetization forms an initial state for a magnetic resonance measurement. The basic magnetic field B0 may have a strength of 3 or more Tesla, so that an extremely high operating current is impressed into the superconducting gradient coils, and the gradient coils are very sensitive to system faults. These faults of the superconducting system may destroy or collapse the superconductivity of the gradient coils, which may, in turn, permanently damage the superconducting magnet system.

The superconducting gradient coils are cooled during operation by a cryostat system operated with liquid coolant (e.g., liquid helium) to achieve superconductivity. The rate of the evaporation of the coolant depends on the heat input into the cryostat system and increases drastically if, for example, a cold shield of the cryostat system is rendered ineffective by the heat, and the cold shield becomes a heat source itself. This is the case, for example, if eddy currents are induced in metallic cold and radiation shields, which may also include thin vapor-deposited films or other elements of the cryostat system.

It is thus desirable (e.g., for sensitive operations in which the magnetic field strength is more than 3T) to avoid induction currents through stray fields in or on the cryostat system that accommodates the superconducting magnetic coil.

A major source of stray fields that act on the cryostat system and the superconducting coil or coils is represented by the gradient system of the magnetic resonance imaging system 10, which generates rapidly switched magnetic fields (e.g., in three spatial directions) for local resolution of the magnetic resonance imaging system 10.

Accordingly, it is desirable to minimize stray fields of the gradient system or other magnet systems that act on the cryostat system.

Figure 1:
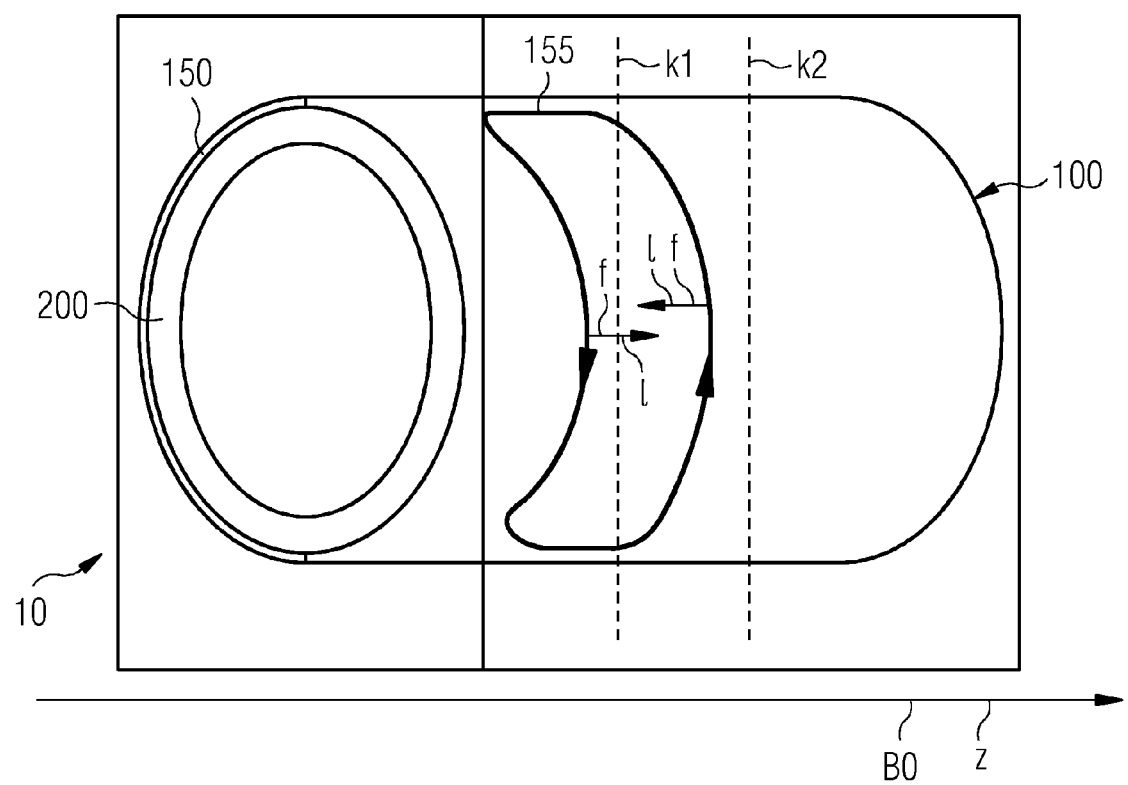
FIG. 1 shows one embodiment of a magnetic resonance imaging system with a possible eddy current distribution that occurs during operation of the magnetic resonance imaging system in or on an electrically conductive shroud of a gradient system.

FIG. 1 shows one embodiment of a magnetic resonance imaging system 10 that is shown schematically as a block for convenience. The magnetic resonance imaging system 10 may include a plurality of elements such as, for example, transmit coils, receive coils, amplifiers, assigned control devices, and a patient tunnel, in which a measurement space is disposed. A homogeneous basic magnetic field B0 that is oriented in the z-direction is also present. The magnetic resonance imaging system 10 includes a gradient system 100 with a gradient coil body, the longitudinal extent of which is oriented in the direction of the basic magnetic field B0. As with the magnetic resonance imaging system 10, the gradient system 100 is shown schematically for convenience.

During operation of the magnetic resonance imaging system 10, Lorentz forces that increase with the strength of the basic magnetic field B0 and excite the gradient system 100 into vibrations, act on current-carrying sections of the gradient system 100. These vibrations are a not-insignificant source of noise, so that a reduction of the vibrations is advantageous. These vibrations may also have a significant effect on the quality of the imaging.

The present embodiments aim to reduce this not-insignificant source of noise and improve the quality of the imaging in a synergetic manner. In one embodiment, a method for reducing mechanical vibrations in the magnetic resonance imaging system 10 that simultaneously suppresses stray fields of the gradient system 100 and reduces the noise load through vibrations of the gradient system 100 is provided.

These aims may be mutually exclusive since, for example, screening devices for stray fields may demand a predetermined conductor configuration. The screening devices for stray fields of the gradient system 100 may include conductive materials, in which eddy currents are induced by the stray fields of the gradient system 100. This represents a point of attack for Lorentz forces created by the basic magnetic field.

The screening devices will thus be excited into vibrations or amplify the vibrations of the gradient system 100 in the magnetic resonance imaging system 10, thereby increasing the noise load during operation of the magnetic resonance system 10.

Thus, the technical limit appears to be constrained by a compromise between screening effect and resulting noise load from screening devices.

The present embodiments, however, provide a method for reducing mechanical vibrations in a magnetic resonance imaging system 10 that is beyond this apparent technical limit.

As shown in FIG. 1, the magnetic resonance imaging system 10 includes a gradient system 100 that, in this embodiment, has a longitudinal tubular gradient coil body 200 with one or more gradient coils. The gradient system 100 includes an electrically conducting shroud 150 that completely encloses the gradient coil body 200 in the circumferential direction. In this embodiment, the shroud 150 is formed of 2 mm thick copper, which may correspond to the limit of the penetration depth of eddy currents by the skin effect (e.g., the skin penetration depth).

The shroud 150 forms a screening device for stray fields of the gradient system 100 that is rigidly connected to the gradient coil body 200. Extent and orientation of the shroud 150 determine the screening effect of the shroud 150. The screening effect of a shroud is based on eddy currents 155 that are easily modifiable without significantly affecting the screening effect. This is not the case for active screening devices such as opposingly-wound coils for screening, so that for active screening devices, the technical limit is constrained by the compromise mentioned above. The eddy current distribution may be considered, at least to a certain degree, as self-organizing, so that, once again, an optimal screening effect is set.

In accordance with the present embodiments, the method for reducing mechanical vibrations in the magnetic resonance imaging system 10 may include the following acts.

In an initial act, a mechanical natural vibration mode s of the gradient coil body 200 in the magnetic resonance imaging system 10 is determined.

A natural vibration mode s may, for example, be determined during the design phase of the magnetic resonance imaging system 10, using, for example, a simulation. For example, there may be an underlying model for describing a damped mechanical vibration, $$M\ddot{\varphi} + D\dot{\varphi} + K\varphi = 0 \quad (1)$$

where the natural vibration mode s may be determined with or using a natural value or a natural frequency ω determined from the approach, $$\varphi = \exp(i\omega t)\Phi \quad (2)$$

Equation (2) describes a vibration equation with the natural frequency ω for a natural vector Φ of a natural vibration mode s, and the natural vector describes the deflection of the gradient system at location x. In the model, M describes a mass matrix, K describes a matrix of elasticity, and D describes a damping matrix. These matrices are added in this way to the model assigned to properties of the gradient system 100 (e.g., the gradient coil body 200 and of the shroud 150).

In addition, the already existing natural vibration modes s in the magnetic resonance imaging system 10 from gradient systems 100 may be directly measured. The frequency range, from which the specified natural vibration mode s is selected or in which natural vibration modes are searched, may be restricted to vibration frequencies that are able to be excited during the operation of the magnetic resonance imaging system (e.g., vibration frequencies defined as a function of the operating mode of the magnetic resonance imaging system 10). As such, a frequency interval that is determined by the most frequently used operating mode of the magnetic resonance imaging system 10 may be taken into account or considered.

Figure 2:
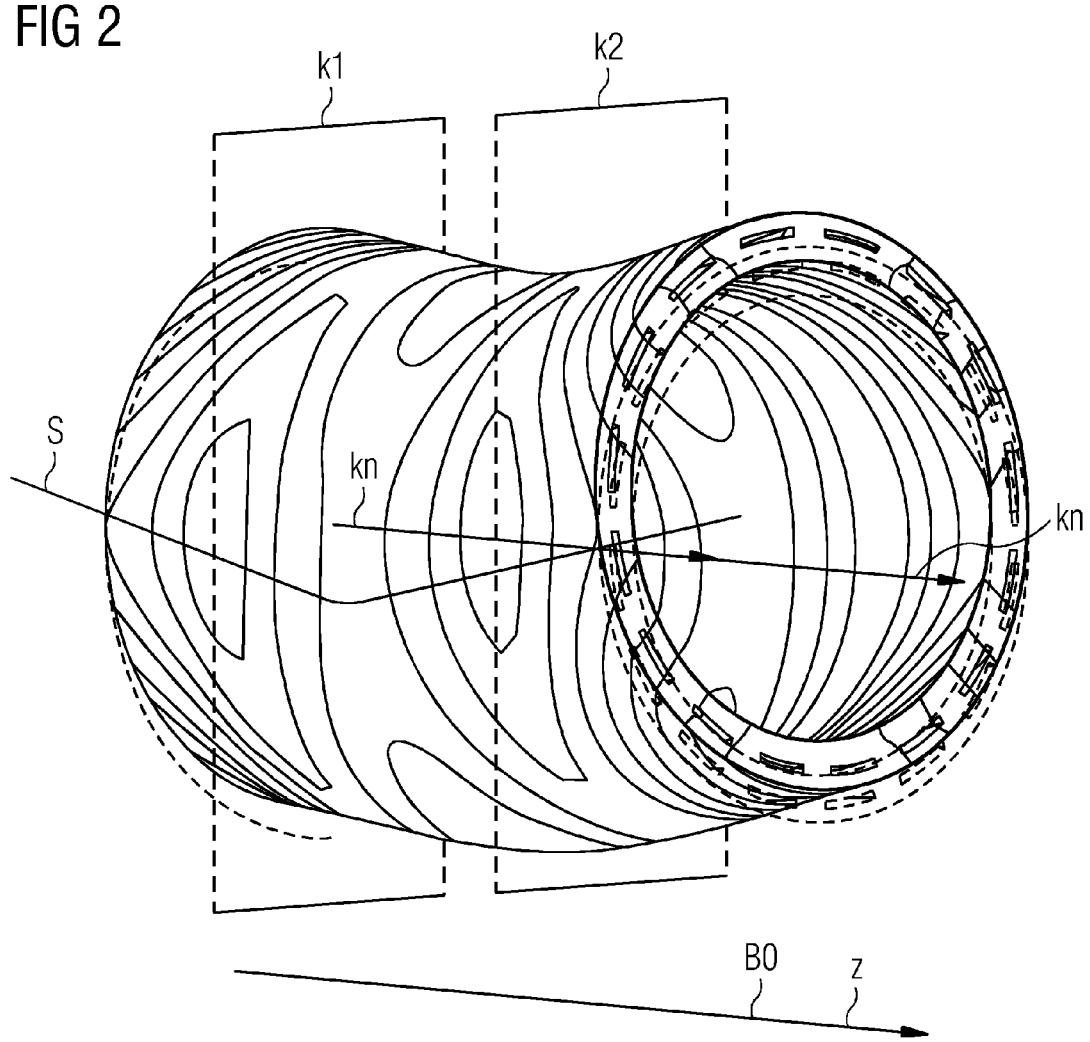
FIG. 2 shows a three-dimensional diagram of an exemplary natural vibration of the gradient coil body.
Figure 3:
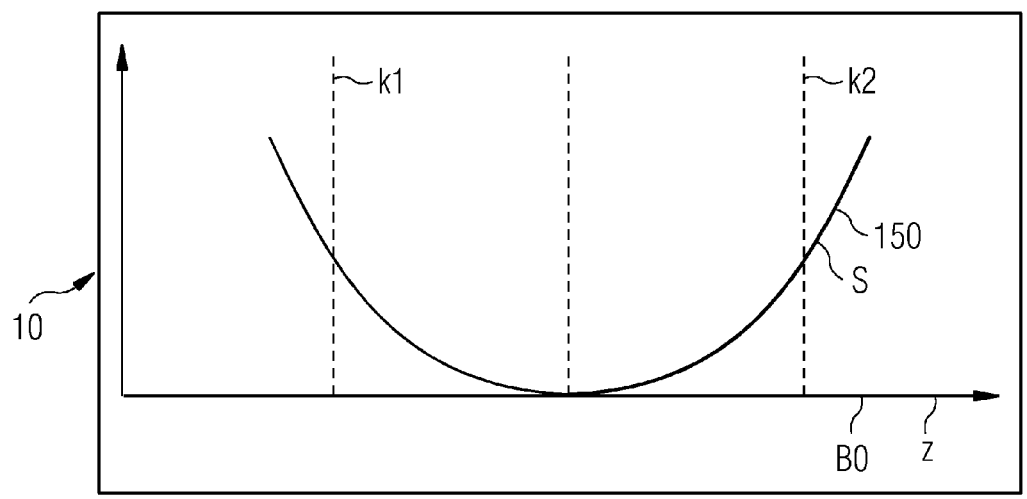
FIG. 3 shows a two-dimensional diagram of an exemplary natural vibration of the gradient coil body.

A typical natural vibration mode s of the gradient system 100 or of the gradient coil body 200 is, for example, shown in three dimensions in FIG. 2 and in two dimensions in FIG. 3. In this embodiment, the natural vibration mode s determines two nodal planes k1 and k2. Parts of the gradient coil body 200 that are disposed in the nodal planes k1, k2, remain in a fixed location on the excitation of the natural vibration mode s (e.g., the parts remain at rest).

In other embodiments, specific natural vibration modes s may include underlying cylinder modes that are described by 4, 6 or any other (e.g., higher) number of nodal planes.

In a subsequent act, excitation force components f for this natural vibration mode s are determined. In some embodiments, this act may be combined with a further subsequent act, in which electrically conductive areas of the gradient system 100 that create Lorentz force components l during operation of the magnetic resonance image system 10 and contribute to excitation force components f may be defined. The electrically conductive areas may thus include both the gradient coils and also the electrically-conductive shroud 150.

The determination of the excitation force components f may be restricted to the electrically-conductive areas.

This is shown, by way of example, in FIG. 1 for an eddy current 155 and a few excitation force components f or Lorentz force components l, which act in the radial direction of the longitudinal extent. In this example, there may be a restriction to electrically-conductive areas that carry currents that make an angle not equal to 0 with the basic magnetic field B0. With respect to the electrically conductive shroud, the restriction includes eddy current portions that are oriented in parallel or antiparallel to the basic magnetic field B0.

The determination of the excitation force components f and Lorentz force components l may be performed with or using, for example, a participation factor approach. The participation factors determined with or using the participation factor approach describe the measure of excitation of the natural vibration s by the Lorentz force components l and thus represent a measure of the excitation force components f.

The methods for reducing mechanical vibrations described herein may be simultaneously applied to a number of natural vibration modes (e.g., a number of natural vibration modes s of the gradient system 100 may be selected in the first act). The natural vibration modes s, represented by the natural vectors Φ, algebraically form a basic system (e.g., minimal generating system from linear independent vectors). The Lorentz force, formed from the Lorentz force components i, may be developed in a linear manner in this base system; this represents the participation factor approach. The development coefficients may form the already mentioned participation factors P and form a scalar product between the Lorentz force at a specific location and a vector which represents the natural vibration mode s at this location (e.g., a vector that describes the movement of the gradient system 100 or the gradient coil body 200 and the shroud 150, at this location and corresponds to a natural vector Φ). Formerly, this may be represented by the equation $$P = \Phi \cdot F_l, \quad (3)$$

where $F_l$ describes the sum of the Lorentz force components l.

The present embodiments relate to an induced eddy current in an observation of the Lorentz force distribution that acts on the gradient coil body 200 and also on the shroud 150. In this context, it may be difficult to determine the conductive areas of the shroud 150 that generate a Lorentz force component l during operation of the magnetic resonance imaging system 10 and contribute to the excitation force components f.

Accordingly, the eddy current distribution in the shroud 150 may be determined. This may be accomplished in any number of ways.

For example, if the stray fields of the magnet system are absorbed completely, it may be assumed that an eddy current would be set such that in the plane of the surface of the electrically conductive shroud 150, field components of an electrical field accompanying a rapidly switched magnetic field disappear.

A further option for defining or determining the eddy current distribution includes considering and calculating a coupling inductance between gradient coils that create a stray field in the gradient system 100 and the shroud 150. The coupling inductance then defines a voltage that, on account of the change over time of the current, will be induced by the gradient coils in the shroud. In addition, the natural inductance of the shroud in the area of the surface of the eddy current distribution may be considered. As a result of the magnetic flux from the eddy current distribution in the surface, a voltage will be induced in the shroud 150 in the same way and proportional to the change in the current distribution. With the same time-dependency and the same induced voltages, the induced eddy current is produced from the reciprocal ratio of the negative coupling inductance of the gradient coils to the natural inductance of the shroud 150 multiplied by the current change through the gradient coils.

The eddy current distribution may also be determined with or using a finite element method (e.g., with or using an electronic computer system).

The contribution of the eddy current distribution induced in or on the shroud 150 may be introduced as an additive term into the participation factor calculation, so that explicit excitation force components f that may be attributed to the eddy current distribution in the conductive shroud 150 are identifiable.

The excitation force components f may, for example, be taken into consideration in the optimization of the gradient system 100 in collaboration with the electrically conductive shroud. The additive terms may be considered in or during the determination of a minimum of a target function (e.g., the quadratic function of the current distribution) or may, for example, be introduced into the target function as a linear secondary condition.

After determination of the excitation force components f, unfavorable or the most serious contributions from the conductive shroud 150 may be identified and explicitly assigned to an inherent vector of the mechanical vibrations or of a natural vibration mode s. In some embodiments, the unfavorable or the most serious contributions may be determined by defining a local threshold value for the strength and direction of a Lorentz force component. All Lorentz force components that exceed this threshold value may, in turn, be changed in accordance with the present embodiments, as described below.

In a further act, the specific electrically-conductive areas are modified so that as few as possible of the Lorentz force components l coincide with the specified or identified excitation force components f. This is described in greater detail below. The point of action of the Lorentz force components determined by the previously described identification or determination of Lorentz force components is changed when the conductive shroud 150 is modified.

As noted above, the methods described herein may be simultaneously applied to or for a number of different natural vibration modes s.

Advantageously, in the exemplary embodiment shown in FIG. 1, the electrically-conductive shroud 150 has a thickness that, at least transverse to a longitudinal extent or longitudinal direction z of the gradient coil body 200, may completely screen the stray field of the gradient system 100. In this embodiment, the thickness is viewed as being at right angles to the longitudinal extent z of the magnet system 100 or of the gradient coil body 200, respectively. Depending on the structure, a complete screening in almost all directions (e.g., a screening in the longitudinal direction z) may be achieved.

In this embodiment, a material configuration is defined such that the skin effect does not cause any restriction of the screening effect (e.g., prevent a complete screening of the stray fields).

In some embodiments, the screening effect or the thickness of the conductive shroud 150 may be adapted to stray fields that oscillate or occur in a specific frequency domain. For example, the frequency domain is selected in the exemplary embodiment so that the previously described damping mechanisms of the liquid coolant (e.g., the helium) are increasingly suppressed. For this purpose, the frequency domains may, for example, be adapted to stray fields having an oscillation frequency of more than 1000 Hz.

The exemplary embodiment presented in FIG. 1 shows an electrically conductive shroud 150 that completely encloses the gradient coil body 200 in the circumferential direction. The shroud 150 in this embodiment is manufactured from copper. The shielding effect, as already indicated, is optimized by selecting a thickness for the shroud 150 in the range of 1 to 3 mm to a frequency domain in the kHZ range. The thickness of the shroud may be selected so that the thickness essentially corresponds to the penetration depth of shielding currents (e.g., skin penetration depth) created by stray fields of the lower limit frequency of the frequency domain. In the exemplary embodiment, the electrically-conductive shroud has a thickness of approximately 2 mm.

An optimization to a number of frequency domains may, for example, be achieved with or using a combination of a number of electrically-conductive materials (e.g., the noble metals such as gold or silver) that each form separate layers or separate coatings of the electrically-conductive shroud. One or more of the layers may have a different thickness (thickness being once again viewed transverse to the longitudinal extent of the gradient coil body).

The electrically-conductive shroud 150 may, in some embodiments, have one or more modification elements 160 for changing currents induced by Lorentz forces or Lorentz force components l.

For example, the electrically-conductive shroud may be constructed in or using a number of layers for this purpose. In such an example, at least a few of the layers disposed above one another in the radial direction transverse to the longitudinal extent of the gradient coil body 200 may have a surface shape that differs from one or more other layers. For example, breakthroughs with different shapes and positions may be disposed in the respective layers.

Figure 4:
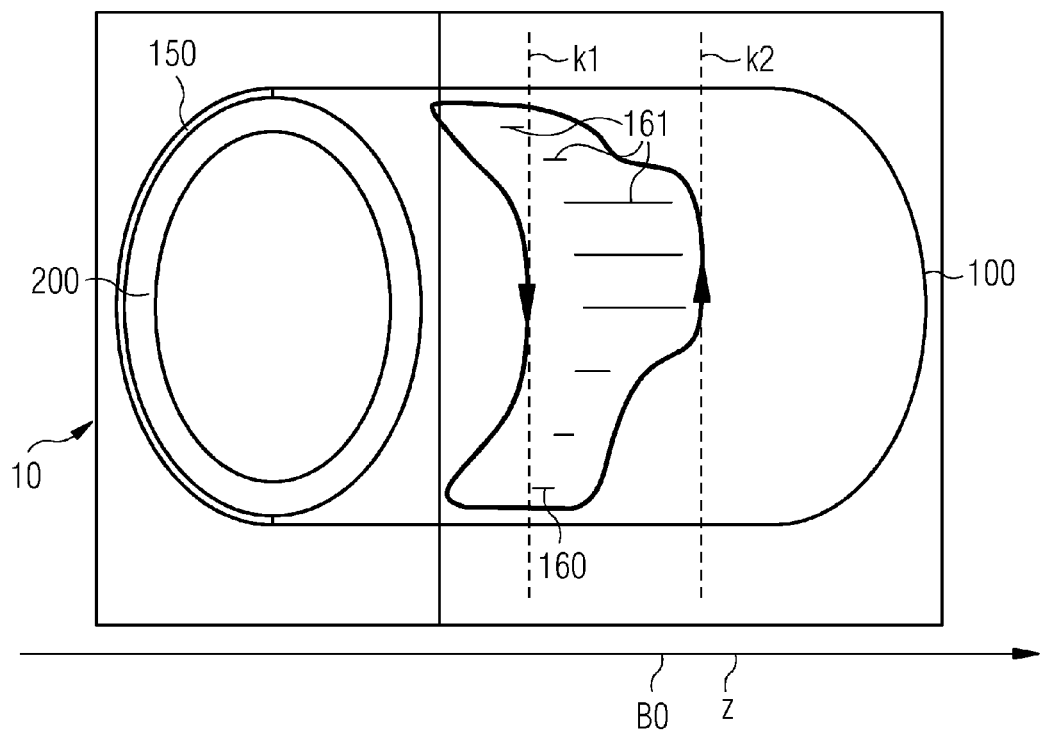
FIG. 4 shows one embodiment of a magnetic resonance imaging system that has modification elements for modifying the eddy current distribution.

As shown in FIG. 4, which shows a conductive shroud that includes one layer, the modification elements 160 are formed by one or more cutouts in the conductive shroud 150. As is evident from the comparison of FIG. 1 and FIG. 4, eddy current paths that occur during operation of the magnetic resonance imaging system 10 in or on the electrically-conductive shroud completely surrounding the gradient coil body 200 in the circumferential direction, may be displaced in or on the electrically-conductive shroud 150 with or by the modification elements 160.

By looking at FIGS. 1 and 4 together, which show the system 10 during different acts of the method, it is evident that the cutouts or modification elements 160 are formed by one or more slots 161 in the conductive shroud 150 to displace the eddy current paths and reduce the natural vibrations of the gradient coil body 200. In this embodiment, FIG. 1 shows an eddy current path that may be established for determining the Lorentz force components l (e.g., at the time at which the magnetic system 10 is constructed).

FIG. 4 shows a plurality of slots 161 that are essentially disposed in parallel to the longitudinal direction z of the gradient coil body 200 to cause a displacement of eddy current paths essentially in the direction of the longitudinal axis of the gradient coil body 200. In the exemplary embodiment, the slots 161 lengthen or shorten the predetermined eddy current path. The screening effect of the electrically-conductive layer is barely affected by this. The location and extent of the cutouts or slots may be defined during the construction of the magnet system 100, but the slots 161 may be modified and/or added after a test commissioning of the gradient system 100 or some later point in time.

In the exemplary embodiment depicted in FIG. 4, the slots 161, by modifying the eddy current paths in the electrically-conductive shroud 150, also displace one or more of the determined Lorentz force components l that act on the conductive shroud 150 into a nodal plane k1, k2 of the natural vibration mode s (k1 and k2 correspond to the nodal planes of FIGS. 2 and 3). A normal vector $k_n$ of the nodal planes k1, k2 is parallel to the longitudinal direction or longitudinal extent of the gradient coil body 200, which is oriented orthogonally to the direction of the thickness of the electrically-conductive shroud 150. The slots 161 are, compared to the longitudinal extent of the gradient coil body 200, short. For example, the slots 161 may only extend a third or less of the longitudinal extent. As shown in FIG. 4, in this exemplary embodiment, a number of slots 161 are disposed in parallel to one another and have matching start point planes and end point planes at right angles to the longitudinal extent of the gradient coil body, such that the slots 161 are of equal length in the direction of the longitudinal extent of the gradient coil body 200.

The displacement in the direction of one of the nodal planes k1 or k2 is illustrated with reference to FIGS. 2 and 3, which outline the vibration states of a typical natural vibration mode s and the displacement of eddy current paths. In the exemplary embodiment, no slots 161 or cutouts are disposed in the nodal plane k1, so that eddy current paths lead through the nodal plane, and the Lorentz force components l for eddy currents portions that lie in this nodal plane do not contribute to the vibration excitation of the natural vibration mode s.

In mathematical terms, the Lorentz force components l that act on the electrically-conductive shroud 150 are displaced using or by the modification elements 160 (e.g., the slots 161), so that a scalar product of the Lorentz force components l and a natural vector $\Phi$ of the natural vibration s is minimized (e.g., the product of the participation factor (which, as already indicated may be formed separately for the shroud) and natural vector is minimized or disappears where possible). This is the case if, for example, established Lorentz force components l, at the point of attack on the magnet system, are orthogonal to natural vectors $\Phi$ of the natural vibration mode s.

In this way, at the time when the gradient system 100 is constructed, a magnetic resonance imaging system 10 that includes a longitudinal tubular gradient coil body 200 with a number of gradient coils may be defined. The gradient system 100 has an electrically-conductive shroud 150 that partially or completely encloses the gradient coil body 200. The electrically conductive shroud 150 is configured, in the area of a nodal plane of a natural vibration mode s, to conduct the highest current density of eddy currents induced during operation of the magnetic resonance imaging system 10 in the conductive electrical shroud 150. A maximum current density may thus be reached in the area of the nodal plane k1 or nodal planes k1 and k2 of the natural vibration modes s.

The corresponding modification elements 160 may be formed, for example, by or from different materials for the conductive shroud 150, different coatings or layers of the conductive shroud 150, or deviations in the thickness of the electrically-conductive layer (e.g., in each case, in the area of the nodal plane k1 or k2 of the natural vibration mode s).

Accordingly, the present embodiments provide effective ways to reduce mechanical natural vibrations in a magnetic resonance imaging system and simultaneously screen out stray fields.

The features of all the exemplary embodiments or developments disclosed in figures may be used in any given combination. The methods, gradient systems and magnetic resonance imaging systems previously described in detail merely involve exemplary embodiments that may be modified by the person skilled in the art in a wide variety of ways without departing from the field of the invention. For example the gradient coil body described as longitudinal and tubular may also have a cross-section in a "U" or "C" shape (e.g., for "open" magnetic resonance tomographs). The use of the indefinite article "a" or "an" does not preclude the features involved also being able to be present multiple times.

While the present invention has been described above by reference to various embodiments, it should be understood that many changes and modifications may be made to the described embodiments. It is therefore intended that the foregoing description be regarded as illustrative rather than limiting, and that it be understood that all equivalents and/or combinations of embodiments are intended to be included in this description.

The invention claimed is:

1. A method for reducing mechanical vibrations in a magnetic resonance imaging system, the magnetic resonance imaging system comprising a gradient system having a gradient coil body with a number of gradient coils and an electrically conductive shroud that at least partially encloses the gradient coil body, the method comprising:
   determining a mechanical natural vibration mode of the gradient coil body in the magnetic resonance imaging system;
   determining excitation force components for the determined mechanical natural vibration mode;
   determining electrically conductive areas of the gradient system that, during operation of the magnetic resonance imaging system, generate a Lorentz force component that contributes to the excitation force components, the electrically conductive areas including the gradient coils and the electrically conductive shroud; and
   modifying the determined electrically conductive areas such that a minimal number of the Lorentz force components coincide with the excitation force components for the determined mechanical natural vibration mode.

2. The method as claimed in claim 1, wherein the electrically conductive shroud has a thickness in a radial direction transverse to a longitudinal extent of the gradient coil body, the thickness corresponding to a skin penetration depth into the shroud.

3. The method as claimed in claim 2, wherein the electrically conductive shroud completely encloses the gradient coil body in a circumferential direction.

4. The method as claimed in claim 1, wherein the electrically conductive shroud completely encloses the gradient coil body in a circumferential direction.

5. The method as claimed in claim 4, wherein the electrically conductive shroud comprises one or more modification elements configured to modify Lorentz forces of induced currents.

6. The method as claimed in claim 5, wherein the one or more modification elements comprise one or more cutouts in the conductive shroud.

7. The method as claimed in claim 6, further comprising displacing one or more of the determined Lorentz force components that act on the electrically conductive shroud into a nodal plane of the natural vibration mode, the one or more of the determined Lorentz force components being displaced by modifying eddy current paths in the conductive shroud, the eddy current paths being modified by the one or more modification elements.

8. The method as claimed in claim 1, wherein the electrically conductive shroud comprises one or more modification elements configured to modify Lorentz forces of induced currents.

9. The method as claimed in claim 8, wherein the one or more modification elements comprise one or more cutouts in the conductive shroud.

10. The method as claimed in claim 8, further comprising displacing one or more of the determined Lorentz force components that act on the electrically conductive shroud into a nodal plane of the natural vibration mode, the one or more of the determined Lorentz force components being displaced by modifying eddy current paths in the conductive shroud, the eddy current paths being modified by the one or more modification elements.

11. The method as claimed in claim 1, further comprising displacing one or more of the determined Lorentz force components that act on the electrically conductive shroud into a nodal plane of the natural vibration mode.

12. The method as claimed in claim 11, wherein the one or more of the determined Lorentz force components are displaced by modifying eddy current paths in the conductive shroud.

13. The method as claimed in claim 11, wherein a normal vector of the nodal plane is oriented parallel to a longitudinal extent of the gradient coil body.

14. The method as claimed in claim 1, further comprising repeating the determining of the mechanical natural vibration mode, the determining of the excitation force components, the determining of the electrically conductive areas, and the modifying for one or more different natural vibration modes.

15. A gradient system comprising:
a gradient coil body having a mechanical natural vibration mode and excitation force components for the mechanical natural vibration mode, the gradient coil body comprising:
a number of gradient coils; and
an electrically conductive shroud that at least partly encloses the gradient coil body; and
electrically conductive areas configured to generate, during operation of a magnetic resonance imaging system, a Lorentz force component that contributes to the excitation force components,
wherein the electrically conductive areas are modified such that a minimal number of the Lorentz force components coincide with the excitation force components for the determined mechanical natural vibration mode.

16. The gradient system as claimed in claim 15, wherein the electrically conductive shroud has a thickness in a radial direction transverse to a longitudinal extent of the gradient coil body, the thickness corresponding to a skin penetration depth into the shroud.

17. The gradient system as claimed in claim 15, wherein the electrically conductive shroud completely encloses the gradient coil body in a circumferential direction.

18. The gradient system as claimed in claim 15, wherein the electrically conductive shroud comprises one or more modification elements configured to modify Lorentz forces of induced currents.

19. The gradient system as claimed in claim 18, wherein the one or more modification elements comprise one or more cutouts in the conductive shroud.

20. The gradient system as claimed in claim 18, wherein the one or more modification elements are configured to displace one or more of the determined Lorentz force components that act on the electrically conductive shroud into a nodal plane of the natural vibration mode.

21. A magnetic resonance imaging system comprising:
a gradient system comprising:
a gradient coil body having a number of gradient coils and an electrically conductive shroud that at least partially encloses the gradient coil body, the gradient coil body having a mechanical natural vibration mode and excitation force components for the mechanical natural vibration mode; and
electrically conductive areas configured to generate, during operation of the magnetic resonance imaging system, a Lorentz force component that contributes to the excitation force components,
wherein the electrically conductive areas are modified such that a minimal number of the Lorentz force components coincide with the excitation force components for the determined mechanical natural vibration mode.

22. The magnetic resonance imaging system as claimed in claim 21, wherein the electrically conductive shroud has an area that is disposed in a nodal plane of the natural vibration mode, and
wherein during operation of the magnetic resonance system, the area conducts the highest current density of eddy currents induced in or on the conductive shroud.

* * * * *